United States Patent [19]

Early et al.

[11] Patent Number: 4,473,794
[45] Date of Patent: Sep. 25, 1984

[54] CURRENT REPEATER

[75] Inventors: Scott H. Early, Indianapolis, Ind.; Roger L. Minear, Wyomissing, Pa.

[73] Assignee: AT&T Bell Laboratories, Murray Hill, N.J.

[21] Appl. No.: 370,498

[22] Filed: Apr. 21, 1982

[51] Int. Cl.³ .............................................. G05F 3/20
[52] U.S. Cl. .................................. 323/315; 307/297; 330/288; 330/300
[58] Field of Search ............... 323/312, 313, 314, 315, 323/316; 307/296 R, 297, 304; 330/277, 288, 296, 299–300, 307

[56] References Cited

U.S. PATENT DOCUMENTS 3,806,742  4/1974  Powell ............................ 323/313 X
3,922,596  11/1975  Cave et al. ......................... 323/316
4,008,441  2/1977  Schade, Jr. ...................... 323/315 X Primary Examiner—Peter S. Wong
Attorney, Agent, or Firm—H. L. Newman

[57] ABSTRACT

An integrated circuit amplifier for a high impedance microphone (100) of the capacitance type is disclosed. The subject amplifier circuit permits the further miniaturization of an electret microphone as it is capable of providing an input impedance simulating a resistor value of hundreds of megohms. The circuit particularly comprises duplicate coupling circuits (101a and 101b), a source of reference direct current voltage (103), and a gain providing circuit (102). The coupling circuits (101a and 101b) comprise a first pair of diodes (Q1 and Q2) symetrically placed about one input terminal (IN1) of the microphone (100). Outputs of the reference voltage source (103) are provided to coupling circuits (101a and 101b) and through the coupling circuits to gain providing circuit 102. Such an arrangement facilitates power supply noise rejection and automatic canceling of direct current voltage drifts. A current repeater circuit (FIG. 8) is employed generally throughout the integrated circuit amplifier for driving various elements. The current repeater comprises at least one unipolar transistor to permit operation at low direct current voltages, while providing an accurately controlled current transfer ratio.

4 Claims, 9 Drawing Figures

FIG. 3 INPUT BIASING CIRCUIT

CURRENT REPEATER

TECHNICAL FIELD

This invention relates to current repeaters such as used in integrated circuit amplifiers for amplifying the output of a high impedance microphone of the capacitance type.

BACKGROUND OF THE INVENTION

Gerhard M. Sessler and James E. West are generally credited with the discovery in 1962 that certain plastic dielectric materials can be employed to advantage in electret microphones. Their electret permanently retained electrostatic charge and provided sufficiently low output impedance to operate with then conventional transistor amplifiers.

A number of manufacturers since 1962 have commercially made available compact packages wherein a semiconductor amplifier and an electret microphone, in combination, provide an electrical signal in the audio frequency range.

In the movement toward further miniaturization of the electret microphone and amplifier combination, however, manufacturers have been impeded in their efforts to employ integrated circuit technology. The problem they have faced is that of applying integrated circuit technology to the generally high impedance (low capacitance) of small electret microphones. Also, it is especially useful of an integrated circuit amplifier that it provide an overall gain to the output of the electret and provide an output impedance several orders of magnitude lower than the impedance of the electret.

One integrated circuit amplifier known commercially as the SL793 capacitance microphone amplifier manufactured by Plessy Semi-conductors is capable of operation with certain electret microphones. In particular, the SL793 amplifier employs series voltage feedback techniques to provide an input impedance of six megohms, a nominal voltage gain of 20 dB, and a maximum output impedance of twenty five ohms. The problem with the Plessy amplifier is that it may be only employed with relatively high capacitance electret microphones if good low frequency response is to be maintained. For example, to achieve a low-frequency cut off of 100 hertz, a microphone with a capacitance of at least two hundred picofarads must be used.

In the design of telephone station apparatus, however, the capacitance presented by small electret microphones may be on the order of one to ten picofarads. In order to provide equivalent low frequency rolloff from the electret microphone, the input resistance of an appropriate amplifier must vary inversely with the microphone capacitance. Thus, series voltage feedback techniques suggested by Plessy have proven insufficient. It is urged that a maximum limitation of that technology is a fifty-megohm input impedance in the voice frequency band of interest.

In addition, electrical noise in the telephone station environment becomes a significant problem at the output of the amplifier. Thus, an integrated circuit amplifier for application with miniature microphones should have a sufficiently low output impedance and provide sufficient gain to permit signal transmission in an electrically noisy environment for considerable distances.

SUMMARY OF THE INVENTION

These problems, and related problems of miniaturization of electret/amplifier combinations, are overcome by the novel integrated circuit amplifier design of the present invention. The present invention overcomes the limitations of the prior art by employing an input coupling circuit comprising one or more forward-biased diodes driven by a low value constant current source, the combination providing an extremely high small-signal input resistance. The combination closely simulates a resistor whose resistance is for larger than the prior art has achieved on a silicon integrated circuit chip. Furthermore, no external biasing resistors or coupling capacitors are needed. The present invention thus permits the further miniaturization of an electret-amplifier combination.

The low value constant current source comprises one element of an input biasing circuit having a ratioed diode circuit for controlling the gate voltage of a unipolar transistor. In a preferred embodiment, first and second forward-biased diodes are symmetrically placed about the inputs to the coupling means. Such a symmetrical arrangement provides further protection and rapid recovery from microphone overload. The arrangement provides progressive signal compression and limiting to input voltage swings of either polarity in excess of normal signal levels (for example, when one taps on the microphone or otherwise overloads it).

The input coupling circuit further comprises unipolar and bipolar transistors for impedance conversion. A bipolar transistor in an emitter follower configuration following a unipolar transistor in a source follower configuration provides two stages of impedance reduction. The input coupling circuit is fully duplicated. In the duplicate coupling circuit, a capacitor of fixed value replaces the electret microphone. This capacitor is chosen to proximate the microphone capacitance, the capacitor helping to reject power supply and other noise. The duplicate coupling circuit provides a DC reference voltage output closely matching that of the first coupling circuit. The difference in output voltages of the first and second coupling circuits is essentially the AC voltage produced by the electret microphone. This voltage difference is amplified by a gain providing amplifier circuit having a differential input. In combination with the coupling circuits, this gain providing amplifier circuit provides greater than unity gain to an electrical signal from the microphone.

A reference source of direct current voltage impervious to supply voltage swings is provided in the present circuit. The reference voltage biases the diodes of the coupling circuits and provides a reference source of DC voltage to the gain providing amplifier circuit.

The present integrated circuit amplifier also comprises a precision current repeater circuit capable of operation at very low voltages. Known current repeaters comprise first and second bipolar transistors in a mirror structure. A third bipolar transistor sometimes is used to reduce current transfer ratio errors due to the base currents of the first two. The application of first and second unipolar transistors in the present current repeater circuit permits a more precisely controlled current transfer ratio, insensitive to bipolar transistor gains. The present current repeater circuit provides current for driving the unipolar transistors of the coupling means. Similar current repeater circuit arrangements are employed for driving other elements of the present integrated circuit amplifier.

DETAILED DESCRIPTION

Figure 1:
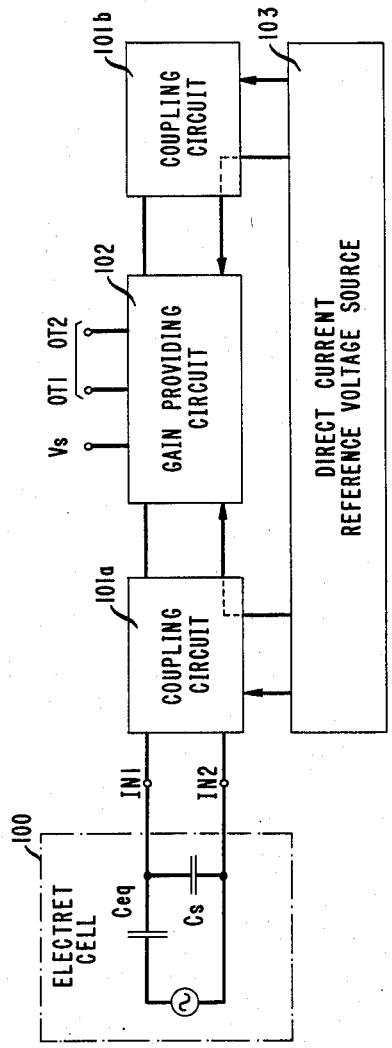
FIG. 1 is a block diagram of the present integrated circuit amplifier for a high impedance microphone of the capacitance type.

Referring to FIG. 1, a block diagram of the present integrated circuit amplifier for a high impedance microphone 100 of the capacitance type is shown. By high impedance microphone of the capacitance type, the specifications and claims are intended to refer to the use of the present invention with what are generally known in the art as electret microphones and with capacitance microphones, the latter differing from the former in that its dielectric is not permanently charged. The present integrated circuit amplifier comprises a coupling means comprising duplicate coupling circuits 101a and 101b for coupling to the high impedance microphone 100 of the capacitance type. Microphone 100 is most likely a miniature electret microphone housed in the same package as the present integrated circuit amplifier. The present integrated circuit amplifier also comprises a gain providing amplifier circuit 102 connected to the outputs of the coupling circuit. A reference source 103 of direct current voltage biases diode circuits of the duplicate coupling circuits 101a and 101b and provides a reference DC voltage to the gain providing amplifier circuit 102.

Input coupling circuit 101a primarily serves an impedance conversion function. More particularly described in the discussion of FIG. 2, the coupling circuit 101a is capable of proximately simulating a resistor on the order of hundreds of megohms. Because the impedance of a capacitive microphone 100 varies with frequency, it is well known in the art that a coupling circuit for optimum performance should provide an impedance greater than the largest impedance provided by the capacitive microphone in the frequency band of interest.

With existent materials, there is a practical lower limit on the gap that can be constructed between charged elements of an electret. Thus, it is well known in the manufacture of electret microphones that as the area of the electret cell decreases, so does the capacitance presented. Accordingly, an electret significantly smaller than electrets currently available must exhibit a much smaller capacitance. Consequently, the optimal input impedance for an amplifier matching such an electret will be much greater. The present coupling circuit 101a provides an input resistance on the order of hundreds of megohms and an output resistance of the order of one to ten kilohms while providing a nearly unity signal voltage gain.

Coupling circuit 101a is entirely duplicated by coupling circuit 101b. In order to perfectly balance the electret cell 100, coupling circuit 101b comprises a capacitance value equivalent to the equivalent capacitance Ceq of the electret cell and the stray capacitance Cs of the connection. The perfectly balanced circuit alleviates power supply noise and other noise.

The coupling circuit 101a and 101b of the present invention are connected to the gain providing amplifier circuit 102. In combination with the coupling circuits, amplifier 102 provides an overall gain to the output of capacitive microphone 100, while reducing the source impedance to a considerably lesser value.

Figure 2:
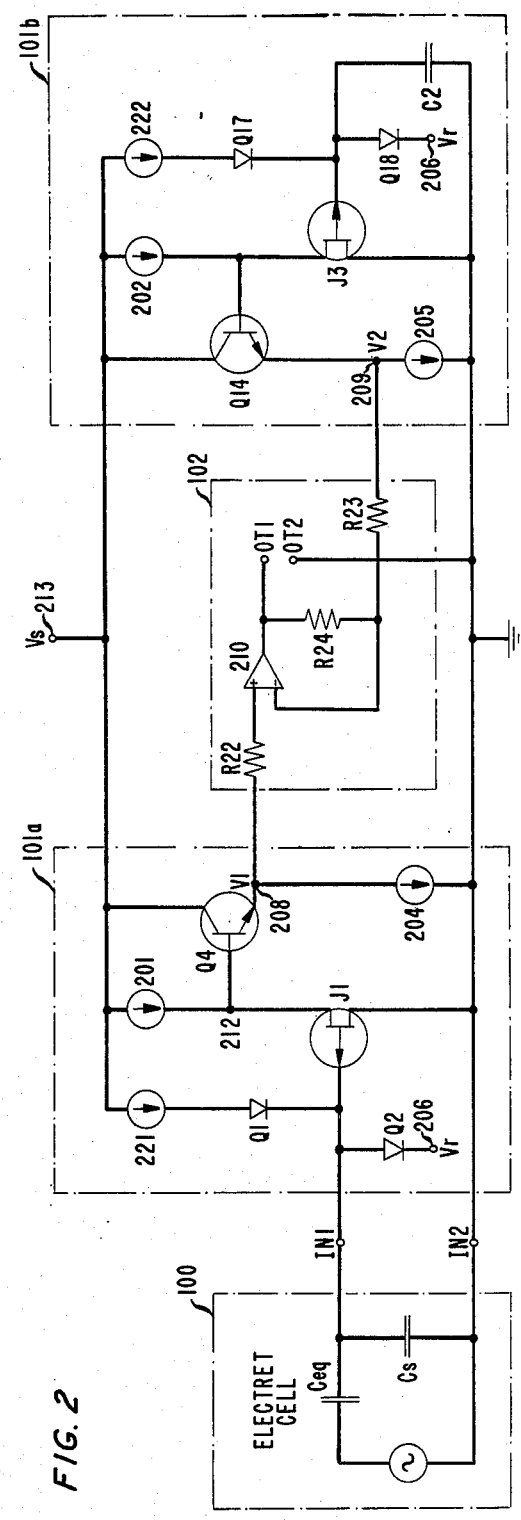
FIG. 2 is a simplified schematic drawing of one embodiment of the present integrated circuit amplifier particularly showing the duplicate coupling circuits.

Referring now to FIG. 2, a simplified schematic drawing of coupling circuits 101a and 101b of FIG. 1 is shown. Similar reference characters are employed in all figures wherever possible to identify similar elements. Also, the first digit value of a reference character for an element identifies in what figure that element first appears. Power supply and element polarities may be reversed in this and subsequent figures, i.e., NPN for PNP transistors, N-channel field effect transistors are shown MOS field effect transistors may be likewise employed.

Coupling circuit 101a comprises input terminals IN1 and IN2 for connecting to capacitive microphone 100. At terminals IN1 and IN2, an extremely high input resistance is presented to the capacitive microphone circuit 100. In particular, a low value constant current source 221 is shown which comprises one element of an input biasing circuit more particularly described in the discussion of FIG. 3. The current source 221 is provided for driving diodes Q1 and Q2, symmetrically placed about input terminal IN1. Reference voltage source 103 provides a DC reference voltage Vr at node 206 for biasing diodes Q1 and Q2. The arrangement of the diodes Q1 and Q2, the current source 221, and the reference voltage at node 206 proximately simulate a resistor having a value on the order of hundreds of megohms.

Input terminal IN1 is also connected to the gate of a unipolar transistor J1. The unipolar transistor J1 is driven by a current source 201. Transistor J1 provides a first stage of impedance reduction and comprises a source which is connected to the base of a bipolar transistor Q4. The bipolar transistor Q4 is connected as an emitter follower for providing a second stage of impedance reduction, if required. It is biased by current source 204. Between transistor Q4 and current source 204 is node 208 which connects the coupling circuit to gain providing amplifier circuit 102.

The quiescent voltage at node 208 is controlled by direct current reference voltage source 103 (FIG. 1). The reference voltage Vr at node 206 is raised to a higher voltage by the anode to cathode drop over diode Q2. That higher voltage likewise appears at node 212 and is dropped in value by the emitter to base voltage of transistor Q4. As a result, the quiescent DC voltage V1 at node 208 directly tracks the reference voltage provided at node 206 by source 103.

As a result of the extremely high impedance at terminal IN1, the electrical signal output of microphone 100 is highly susceptible to noise and, in particular, to power supply noise at 213. To alleviate the noise and to reject its effects, duplicate coupling circuit 101b is provided. In particular, in order to duplicate the microphone 100, a capacitor C2 connects to symmetrical diodes Q17 and Q18 in a similar manner as microphone 100 is connected to diodes Q1 and Q2. The value of capacitor C2 should be chosen so as to simulate the equivalent capacitance Ceq and stray capacitance Cs of microphone 100. In effect, the duplicated combination of diodes Q17 and Q18, unipolar transistor J3 and bipolar transistor Q14 perfectly balance the impedance conversion circuit comprising diodes Q1 and Q2, unipolar transistor J1, and bipolar transistor Q4.

Reference voltage source circuit 103 (FIG. 1) provides reference voltage Vr at node 206 of coupling circuit 101b, the same node as is shown in coupling circuit 101a (FIG. 2). As a result of voltage Vr appearing at node 206, node 209 of duplicate coupling circuit 101b provides an approximately identical DC bias voltage V2 to gain providing amplifier circuit 102 as does node 208 of coupling circuit 101a. The voltage difference between nodes 208 and 209 is essentially the output AC signal voltage of the microphone 100. Thus noise entering at node 213, or DC voltage drifts appearing in both coupling circuits 101a or 101b, appear equally on nodes 208 and 209 as common mode input signals to amplifier 102. Such signals are thus not amplified by the operation of gain providing circuit 102.

Gain providing circuit 102 in simplified form comprises a Complimentary Bipolar Integrated Circuit (CBIC) operational amplifier 210. It is connected to node 208 by resistor R22 and to node 209 by resistor R23. The ratio of resistor R24 to resistor R23 controls the closed loop gain of the gain providing amplifier circuit 102. The amplified output signal of microphone 100 is provided at terminal OT1 with reference to ground terminal OT2. While a CBIC operational amplifier is suggested, other integrated circuit amplifiers known in the art may be substituted therefor, provided any necessary design changes are made to coupling circuit 101a and 101b.

Figure 3:
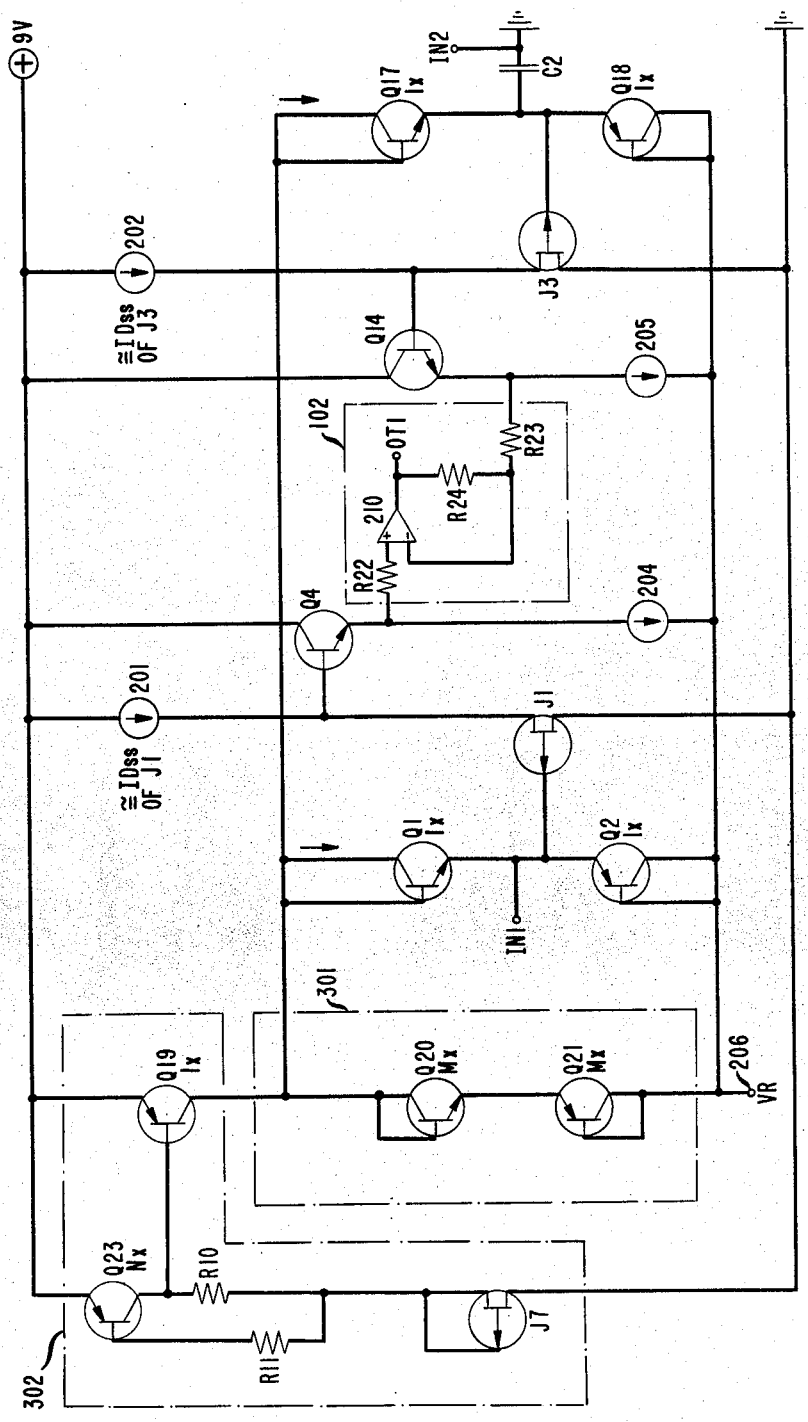
FIG. 3 is a detailed schematic drawing which particularly shows the input biasing circuit of the coupling circuits.

Referring to FIG. 3, a detailed schematic drawing of an input biasing circuit for coupling circuits 101a and 101b is shown. In particular, the input biasing circuit comprises a constant current source 302 and a diode circuit 301. Current source 302 and diode circuit 301 in combination are represented in FIG. 2 by current source 221 and 222. The diode circuit 301 comprises series-connected diodes Q20 and Q21 whose emitter junction areas are a multiple Mx of the emitter junction areas of diodes Q1, Q2, Q17, or Q18.

The current source 302 comprises first and second bipolar transistors Q23 and Q19, the emitter junction area of transistor Q23 being a multiple of that of transistor Q19. The collector of transistor Q19 drives the aforementioned diodes. Transistor Q23 is connected to resistances R10 and R11, which are in turn connected to unipolar transistor J7. The source and gate of transistor J7 are connected forming a two terminal current source. Resistor R10, the emitter area ratio of transistors Q23 and Q19, and the nominal drain saturation current Idss of transistor J7 provide a highly controlled collector current in transistor Q19, whose value is constant and insensitive to small variations in the current through transistor J7.

The present input biasing circuit provides protection from microphone overload. Diodes Q20 and Q21, like diodes Q1 and Q2, are connected between the reference voltage Vr at node 206 and constant current source 302, which forward biases all diodes.

The current I in an integrated circuit diode is given by $$I = J_o A_j \left( e^{\frac{qV}{kT}} - 1 \right).$$

where Jo is a process dependent constant; Aj is the junction area; q is the electronic charge; V is the diode voltage; k is Boltzman's constant; and T is absolute temperature. (Note that (kT/q) at room temperature is approximately 25 millivolts.) Then the small-signal resistance of the diode under forward bias is given by $$R = \frac{dV}{dI} = \frac{kT}{qI}.$$

Thus, diodes fabricated with the same process, with the same applied voltage, and having different junction areas exhibit small-signal resistances which vary inversely with their junction areas.

If the FET gate currents are negligible, Q20 has an emitter junction area fifty times that of similarly fabricated diode Q1, and diodes Q21 and Q2 are similarly fabricated and area-ratioed, it follows that Q1 and Q2 will each exhibit a small-signal resistance fifty times that of Q20 and Q21.

One particular purpose of diodes Q1 and Q2 is to minimize the input capacitance presented to microphone 100 at terminal IN1. However, the symmetrical placement of first and second diodes Q1 and Q2 about input IN1, together with biasing diodes Q20 and Q21 provides a further advantage. Such a symmetrical diode arrangement provides progressive signal compression and limiting to voltage swings from the microphone of either polarity which are in excess of normal signal levels. This might occur, for example, when one taps the microphone, blows into it, or otherwise overloads it.

Figure 4:
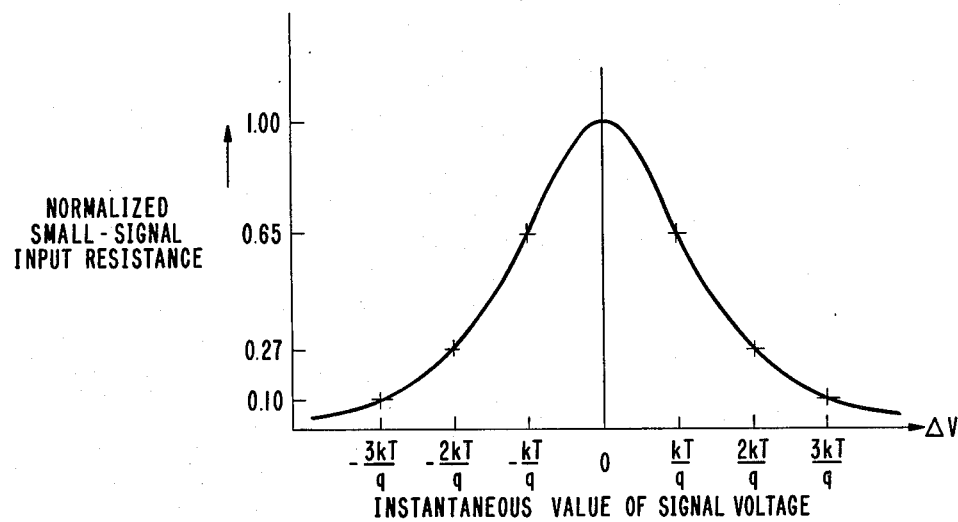
FIG. 4 is a graphical depiction of the small signal resistance provided by elements of the input biasing circuit of FIG. 3 as a function of instantaneous signal voltage level provided by a microphone of the capacitance type.

Using the above equations for current flow in a diode, it is possible to calculate the small-signal input resistance between input IN1 and ground as a function of the instantaneous AC signal input voltage from microphone 100. A plot of this relationship is shown in FIG. 4. For small AC signal voltages ($<\pm kT/q$), the small-signal input resistance is relatively constant. However, if the instantaneous signal voltage becomes large ($<\pm 2 kT/q$), the small-signal resistance decreases exponentially with instantaneous signal voltage magnitude. Thus any unwanted charge on the input node IN1 (FIGS. 1, 2, and 3) due to large-amplitude transient signals from microphone 100 is quickly dispersed, rapidly restoring quiescent bias conditions. Thus this circuit provides a large input resistance (and hence good low-frequency response) for small signals, while providing a small input resistance, progressive signal limiting, and fast overload recovery for large signals.

Figure 5:
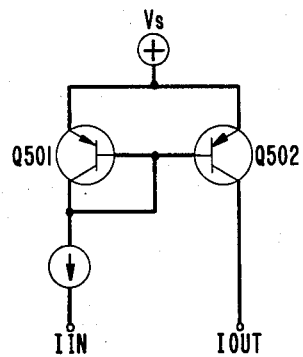
FIG. 5 is a detailed schematic drawing of a prior art current repeater.

Referring now to FIG. 5, it is known in the prior art to construct current repeaters from similarly processed first and second bipolar transistors Q501 and Q502, as shown in FIG. 5. The current transfer ratio Iout/Iin is nominally set by the ratio of emitter junction areas of Q502 and Q501. The transistors have their emitters connected, their bases connected, the first transistor Q501 also having its collector and base connected to the input current Iin, with output current Iout being taken from the collector of the second transistor. This circuit requires one base-emitter diode drop, or about 0.7 volts, to operate. However, if output currents much larger than the input current are required, the current transfer ratio Iout/Iin of this circuit becomes undesirably sensitive to the bipolar transistor current gain parameter known in the art as Hfe.

Figure 6:
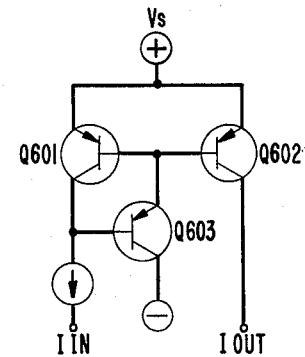
FIG. 6 is a detailed schematic drawing of a second prior art current repeater.

It is also known in the prior art to construct current repeaters from three bipolar transistors, as shown in FIG. 6. The emitter of third transistor Q603 supplies base current to the first two, with its base connected to the collector of the first transistor Q601 and to the input current source Iin. The current transfer ratio Iout/Iin of this circuit is reasonably insensitive to the bipolar transistor current gain parameter Hfe. However, the circuit requires two base-emitter diode drops, or about 1.4 volts, to operate. This can be a significant disadvantage in low-voltage circuits.

Figure 7:
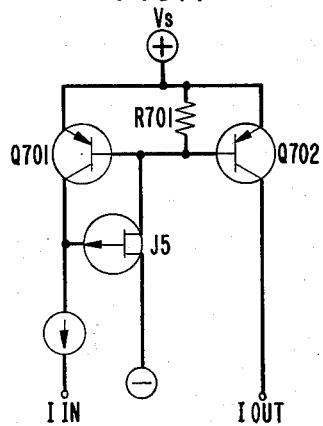
FIG. 7 is a detailed schematic drawing of a first embodiment of a current repeater in accordance with the present invention.

Replacing the third bipolar transistor with a unipolar transistor J5, as shown in FIG. 7, can reduce the required operating voltage to as low as one diode drop (0.7 volt). The source of unipolar transistor J5 is connected to the bases of the bipolar transistors Q701 and Q702, and its gate is connected to the collector of the first bipolar transistor Q701 and to the input current Iin. A resistor R701 or other source of current may be connected between the emitters and bases of the two bipolar transistors Q701 and Q702 to control the biasing of unipolar transistor J5. The current transfer ratio of this circuit can be made highly insensitive to the bipolar transistor current gain parameter life.

Figure 8:
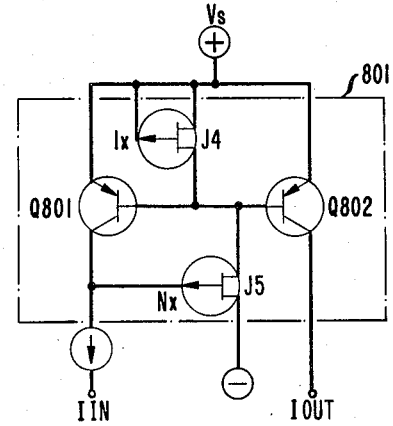
FIG. 8 is a detailed schematic drawing of a preferred embodiment of a current repeater, in accordance with the present invention, the current repeater driving the coupling circuits and other elements of the present integrated circuit amplifier.

In a preferred embodiment shown in FIG. 8, a second unipolar transistor J4 is connected in place of the previously described R701. The gate and source of transistor J4 are tied to the emitters of bipolar transistors Q801 and Q802. The drain of transistor J4 is connected to the source of unipolar transistor J5 and the bases of bipolar transistors Q801 and Q802.

The circuit of FIGS. 7 and 8 may be understood by analyzing the circuit of FIG. 8. Assume that the drain saturation current Idss of transistor J4 is a known fraction (for example, 0.4) of the drain saturation current Idss of transistor J5. This may be accomplished by appropriately ratioing the channel length/width 1x and Nx ratios of transistors J4 and J5, respectively, on an integrated circuit chip. Assume further, for simplicity of analysis, that the combined base currents of bipolar transistors Q801 and Q802 are much less than the drain saturation current of transistor J4. For simplicity of analysis, assume that transistors J4 and J5 are both operating in or near their saturation mode, with drain currents not strongly dependent on their drain-source voltages. Then the drain current Id of either transistor J4 of J5 is given by $$Id = Idss\left(1 - \frac{Vgs}{Vp}\right)^2$$

where Vgs is the gate to source voltage and Vp the pinchoff voltage. Then, for transistor J5:

$$Vgs = Vp\left[1 - \sqrt{\frac{Id(J5)}{Idss(J5)}}\right].$$

But, transistors J4 and J5 have been connected so that $$Id(J5) \cong Idss(J4) = 0.4 Idss(J5).$$

Hence $$Vgs \cong 0.37 Vp.$$

Accordingly, if we assume that bipolar transistors Q801 and Q802 exhibit a base to emitter voltage drop of 0.7 volts and a nominal pinchoff voltage for the unipolar transistor J4 or J5 is 0.5, then the collector to emitter voltage drop across transistor Q801 is reduced to about 0.5 volts, or less than one diode voltage drop. Thus, the present current repeater operates at voltages as low as 0.7 volts. At the same time, the current transfer ratio is independent of the value of the bipolar transistor gains of transistors Q801 and Q802.

Figure 9:
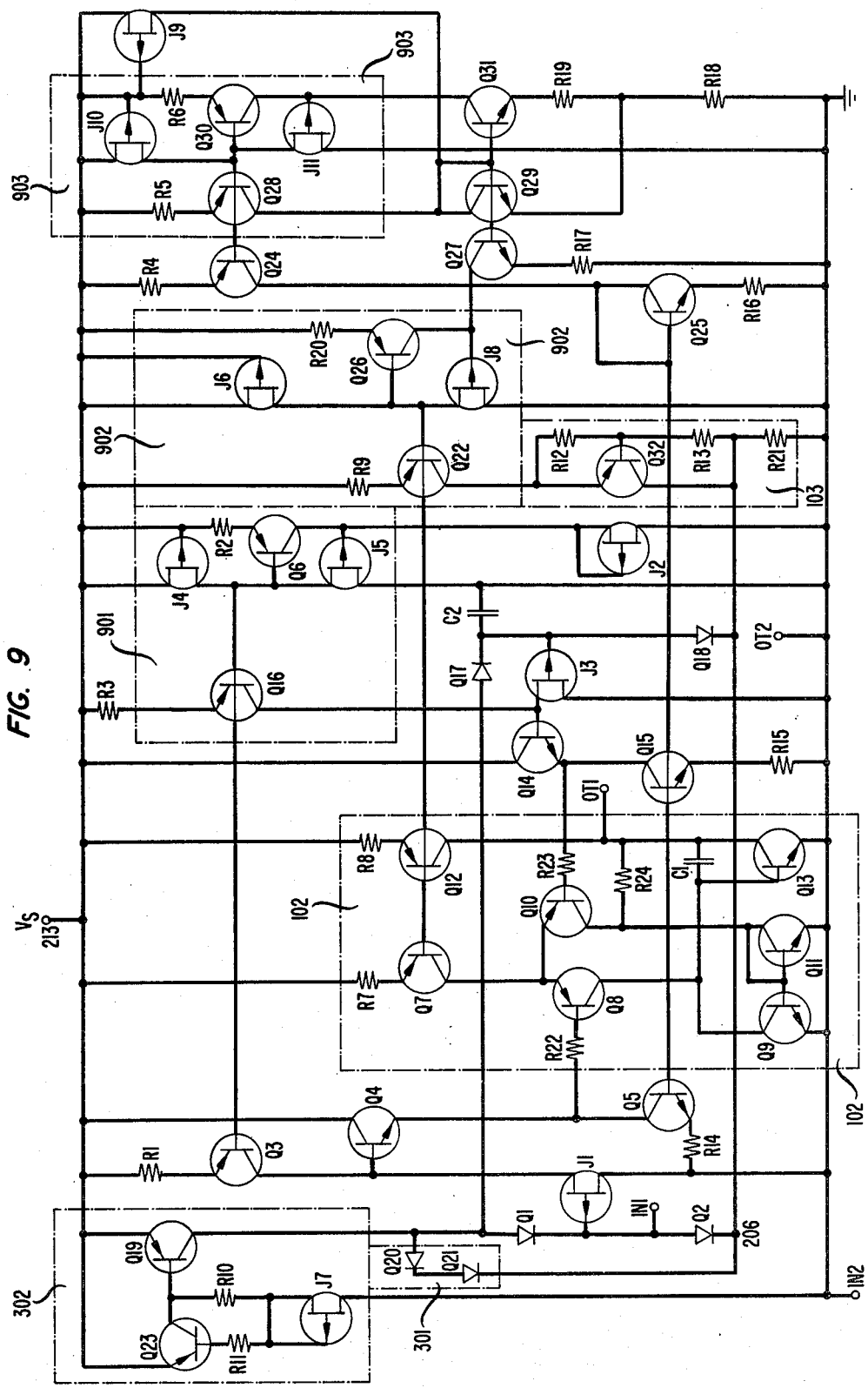
FIG. 9 is a detailed schematic drawing of one embodiment of the present integrated circuit amplifier.

Referring now to FIG. 9, a detailed schematic drawing of one embodiment of the present integrated circuit amplifier for a high impedance microphone of the capacitance type is shown. Elements previously identified are shown. In particular, a plurality of current repeaters 901, 902, and 903 sharing the design of current repeater 801 of FIG. 8 are employed throughout for driving various elements of the circuit. Transistors Q3, Q7, Q12, and Q24 provide additional current taps from circuits 901, 902 and 903. Also, the previously described gain providing amplifier circuit 102 is shown in detail and comprises transistors Q7, Q8, Q9, Q10, Q11, Q12, Q13, resistors R22, R23, R24, and capacitor C1.

Introduced for the first time in particular detail is reference voltage circuit 103. It comprises bipolar transistor Q32 and voltage dividing resistors R12, R13, and R21. At high supply voltages transistor Q22 of current source 902 is active with its collector-base junction reverse-biased. Transistor Q22 thus provides a constant collector current. This current, flowing through resistor R21, provides a reference voltage at node 206 that is independent of supply voltages at node 213. At low supply voltages, however, transistor Q22 saturates, and transistor Q32, along with resistors R12, R13, and R21, provides a DC reference voltage that is sufficiently below the supply voltage Vs to maintain bias current flow in diodes Q1 and Q2 (preventing the saturation of transistor Q19). Thus reference voltage circuit 103 will function at a lower supply voltage Vs at node 213 than is possible with a fixed reference bias.

What is claimed is:

1. A current repeater comprising:
   first and second bipolar transistors adapted to be connected to a source of direct current voltage;
   a first unipolar transistor providing a current path for base currents of the bipolar transistors; and
   a second unipolar transistor providing an operating current for the first unipolar transistor, the channel aspect ratio of the second unipolar transistor being proportioned to the channel aspect ratio of the first unipolar transistor to provide low voltage operation of the current repeater.

2. A current repeater as in claim 1 wherein the channel aspect ratio of the second unipolar transistor is proportioned to the channel aspect ratio of the first unipolar transistor to provide a drain saturation current for the second unipolar transistor that is a fraction of the drain saturation current of the first unipolar transistor.

3. A current repeater as in claim 2 wherein the combined base currents of the first and second bipolar transistors is less than the drain saturation current of the second unipolar transistor.

4. A current repeater as in claim 2 wherein the first and second bipolar transistors and the first and second unipolar transistors are included in an integrated circuit so that the drain saturation current of the second unipolar transistor is a controlled fraction of the drain saturation current of the first unipolar transistor.

* * * * *